(12) United States Patent
Cao et al.

(10) Patent No.: US 11,250,765 B2
(45) Date of Patent: Feb. 15, 2022

(54) DISPLAY DRIVING CIRCUIT

(71) Applicant: WUHAN CHINA STAR OPTOELECTRONICS TECHNOLOGY CO., LTD., Hubei (CN)

(72) Inventors: Haiming Cao, Hubei (CN); Chao Tian, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 16/979,550

(22) PCT Filed: Jun. 15, 2020

(86) PCT No.: PCT/CN2020/096155
§ 371 (c)(1),
(2) Date: Sep. 10, 2020

(87) PCT Pub. No.: WO2021/227185
PCT Pub. Date: Nov. 18, 2021

(65) Prior Publication Data
US 2021/0358386 A1 Nov. 18, 2021

(51) Int. Cl.
G09G 3/20 (2006.01)
(52) U.S. Cl.
CPC ... *G09G 3/2096* (2013.01); *G09G 2310/0267* (2013.01); *G09G 2310/08* (2013.01)

(58) Field of Classification Search
CPC combination set(s) only.
See application file for complete search history.

(56) References Cited

U.S. PATENT DOCUMENTS

| 2008/0042965 | A1 | 2/2008 | Cheng et al. | |
|---|---|---|---|---|
| 2011/0116592 | A1* | 5/2011 | Tsai | G11C 19/184 377/79 |
| 2016/0275849 | A1 | 9/2016 | Tsai | |
| 2017/0330526 | A1* | 11/2017 | Fan | G09G 3/3677 |
| 2019/0066559 | A1* | 2/2019 | Wang | G09G 3/3677 |
| 2020/0043436 | A1* | 2/2020 | Li | G09G 3/3688 |
| 2021/0090516 | A1 | 3/2021 | Xu | |

FOREIGN PATENT DOCUMENTS

| CN | 106033658 A | 10/2016 |
|---|---|---|
| CN | 108630167 A | 10/2018 |
| CN | 108962166 A | 12/2018 |
| CN | 110070838 A | 7/2019 |
| CN | 110782855 A | 2/2020 |

* cited by examiner

*Primary Examiner* — Towfiq Elahi
(74) *Attorney, Agent, or Firm* — Mark M. Friedman

(57) ABSTRACT

A display driving circuit is provided. The display driving circuit includes a multi-stage driving unit, and each stage of the driving unit includes a pull-up control unit and a pull-up unit. The pull-up unit is electrically connected to a second high voltage signal input terminal, so that high voltage signal input from the second high voltage signal input terminal is directly transmitted to a cascade signal output terminal through the pull-up unit, which further enables the display driving circuit to output a high voltage driving signal while a gate of a thin film transistor inside the display driving circuit is kept at low voltage.

15 Claims, 3 Drawing Sheets

DISPLAY DRIVING CIRCUIT

The present application claims priority of a Chinese patent application filed with the National Intellectual Property Administration on May 15, 2020, application No. 202010413447.7, titled "Display driving circuit", which is incorporated by reference in the present application in its entirety.

FIELD OF INVENTION

This application relates to a field of display technology, and in particular to a display driving circuit.

BACKGROUND OF INVENTION

Gate driver on array (GOA) technology, that is, an array substrate driving technology, directly manufactures scan driving circuit on an array substrate, thereby saving space for separately setting the scan driving circuit with an integrated chip. It is beneficial for realizing a narrow bezel design of a display and reduces a bonding process of the integrated chip. Therefore, the GOA technology is more and more widely used in the field of display panels.

The display driving circuit based on the GOA technology needs to provide scanning signals for rows of display units of a display panel. Thus, the driving signal output by each GOA unit must be strong enough to ensure that the rows of the display units can be illuminated at the same time. Currently, a mainstream trend of the display panel is large size, high frequency, and high resolution. This type of display panel has higher requirements for strength of display driving signals. In the prior art, a method of improving driving capability of a GOA circuit is to increase a voltage difference between a gate and a source of a thin film transistor inside the GOA circuit, thereby increasing a strength of driving signal output by the GOA unit. However, increasing the voltage difference between the gate and the source of the thin film transistor will increase an internal stress of the thin film transistor, which is not conducive to stable operation of the GOA circuit, and may seriously cause the GOA circuit to fail, as well as increase power consumption of the display panel.

Technical Problem

For a GOA circuit, the method of increasing an output driving signal strength of a GOA unit by increasing voltage difference between a gate and a source of a thin film transistor inside a circuit increases internal stress of the thin film transistor, which is not conducive to the stable operation of the GOA circuit, and may seriously cause the GOA circuit to fail, and increase the power consumption of a display panel.

SUMMARY OF INVENTION

In order to solve the above technical problems, the solutions provided by this application are as follows:

The present application provides a display driving circuit, which includes a multi-stage driving unit, and each stage of the driving unit includes: a pull-up control unit electrically connected to a first control signal input terminal, a first cascade signal input terminal, a low voltage signal input terminal, a first high voltage signal input terminal, a first clock signal input terminal, and a first node, configured to transmit a combination signal input from the first control signal input terminal, the low voltage signal input terminal, and the first clock signal input terminal to the first node under control of signals input from the first cascade signal input terminal and the first high voltage signal input terminal; a pull-up unit electrically connected to a second high voltage signal input terminal, the first node, and the cascade signal output terminal, configured to transmit a signal input from the second high voltage signal input terminal to the cascade signal output terminal under a signal control of the first node; wherein a voltage input from the second high voltage signal input terminal is greater than a voltage input from the first high voltage signal input terminal.

In the display driving circuit of the present application, the pull-up control unit includes a first transistor, a second transistor, a first capacitor, and a second capacitor. A gate, a source, and a drain of the first transistor are electrically connected to the first cascade signal input terminal, the first control signal input terminal, and the second node, respectively. A gate, a source, and a drain of the second transistor are electrically connected to the first high voltage signal input terminal, the second node, and the first node, respectively. Both ends of the first capacitor are electrically connected to the low voltage signal input terminal and the second node, respectively, and both ends of the second capacitor are electrically connected to the first clock signal input terminal and the first node, respectively.

In the display driving circuit of the present application, the pull-up unit includes a third transistor, a gate, a source, and a drain of the third transistor are electrically connected to the first node, the second high voltage signal input terminal, and the cascade signal output terminal, respectively.

In the display driving circuit of the present application, the driving unit of each stage further includes: a pull-down control unit electrically connected to the first control signal input terminal, a second clock signal input terminal, a third clock signal input terminal, a second control signal input terminal, the first high voltage signal input terminal, the low voltage signal input terminal, a second cascade signal input terminal, and a third node, configured to transmit signal input from the first high voltage signal input terminal and/or the low voltage signal input terminal to the third node under common control of signals input from the first control signal input terminal, the second clock signal input terminal, the third clock signal input terminal, the second control signal input terminal, and the second cascade signal input terminal.

In the display driving circuit of this application, the pull-down control unit includes a fourth transistor, a fifth transistor, a sixth transistor, a seventh transistor, an eighth transistor, a ninth transistor, and a third capacitor. A gate and a source of the fourth transistor are electrically connected to the first control signal input terminal and the second clock signal input terminal, respectively. A drain of the fourth transistor is electrically connected to a drain of the fifth transistor and a gate of the sixth transistor. A gate and a source of the fifth transistor are electrically connected to the second control signal input terminal and the third clock signal input terminal, respectively. A source and a drain of the sixth transistor are electrically connected to the first high voltage signal input terminal and the third node, respectively. A gate and a source of the seventh transistor are electrically connected to the second cascade signal input terminal and the second control signal input terminal, respectively. A drain of the seventh transistor is electrically connected to a gate of the eighth transistor. A source and a drain of the eighth transistor are electrically connected to the low voltage signal input terminal and the third node, respectively. A gate and a source of the ninth transistor are electrically connected to the third node and the low voltage signal input terminal, respectively. Both ends of the third capacitor are electrically connected to the low voltage signal input terminal and the third node, respectively.

In the display driving circuit of the present application, each stage of the driving unit further includes a pull-down unit, the pull-down unit is electrically connected to the third node, the low voltage signal input terminal, and the cascade signal output terminal, configured to transmit a signal input from the low voltage signal input terminal to the cascade signal output terminal under a signal control of the third node.

In the display driving circuit of the present application, the pull-down unit includes a thirteenth transistor. A gate, a source, and a drain of the thirteenth transistor are electrically connected to the third node, the low voltage signal input terminal, and the cascade signal output terminal, respectively.

In the display driving circuit of the present application, each stage of the driving unit further includes a jump control unit. The jump control unit is electrically connected to the third node, the low voltage signal input terminal, a first jump signal input terminal, a second jump signal input terminal, and the cascade signal output terminal, configured to transmit signal input from the low voltage signal input terminal to the third node and/or the cascade signal output terminal under control of signal input from the first jump signal input terminal and the second jump signal input terminal.

In the display driving circuit of the present application, the jump control unit includes a tenth transistor, an eleventh transistor, and a twelfth transistor. A gate and a source of the tenth transistor and a gate of the eleventh transistor are electrically connected to the first jump signal input terminal. A drain of the tenth transistor is electrically connected to the cascade signal output terminal. A source and a drain of the eleventh transistor are electrically connected to the low voltage signal input terminal and the third node, respectively. A gate, a source, and a drain of the twelfth transistor are electrically connected to the second jump signal input terminal, the low voltage signal input terminal, and the cascade signal output terminal, respectively.

In the display driving circuit of the present application, the first cascade signal input terminal of the driving unit of n stage is electrically connected to the cascade signal output terminal of the driving unit of n−2 stage, wherein n is an integer greater than 2.

In the display driving circuit of the present application, the second cascade signal input terminal of the driving unit of n stage is electrically connected to the cascade signal output terminal of the driving unit of n+2 stage, wherein n is an integer greater than 2.

In the display driving circuit of the present application, the display driving circuit is connected to four clock signal lines, which are a first clock signal line, a second clock signal line, a third clock signal line, and a fourth clock signal line.

The first clock signal input terminal, the second clock signal input terminal, and the third clock signal input terminal of the driving unit of k+4i stage are electrically connected to the first clock signal line, the second clock signal line, and the fourth clock signal line.

The first clock signal input terminal, the second clock signal input terminal, and the third clock signal input terminal of the driving unit of k+4i+1 stage are electrically connected to the second clock signal line, the third clock signal line, and the first clock signal line.

The first clock signal input terminal, the second clock signal input terminal, and the third clock signal input terminal of the driving unit of k+4i+2 stage are electrically connected to the third clock signal line, the fourth clock signal line, and the second clock signal line.

The first clock signal input terminal, the second clock signal input terminal, and the third clock signal input terminal of the driving unit of k+4i+3 stage are electrically connected to the fourth clock signal line, the first clock signal line, and the third clock signal line.

Wherein k is an integer greater than or equal to 1, and i is an integer greater than or equal to 0.

In the display driving circuit of the present application, the first cascade signal input terminal of the driving unit of $1_{th}$ stage and the first cascade signal input terminal of the driving unit of $2_{nd}$ stage are respectively electrically connected to a trigger signal line.

In the display driving circuit of the present application, the display driving circuit includes the driving unit of N stages. The first control signal input terminal is configured to be input with a high voltage, and the second control signal input terminal is configured to be input with a low voltage, and the driving unit of $1_{th}$ stage to the driving unit of N stage sequentially output cascade signals; wherein N is an integer greater than or equal to 1.

In the display driving circuit of the present application, the display driving circuit includes N stage driving units.

The first control signal input terminal is configured to input with a low voltage, and the second control signal input terminal is configured to input with a high voltage, the driving unit of N stage to the driving unit of $1_{th}$ stage sequentially output cascade signals.

Wherein N is an integer greater than or equal to 1.

The present application provides a display driving circuit, which includes a multi-stage driving unit, and each stage of the driving unit includes: a pull-up control unit electrically connected to a first control signal input terminal, a first cascade signal input terminal, a low voltage signal input terminal, a first high voltage signal input terminal, a first clock signal input terminal, and a first node, configured to transmit combination signal input from the first control signal input terminal, the low voltage signal input terminal, and the first clock signal input terminal to the first node under control of signals input from the first cascade signal input terminal and the first high voltage signal input terminal; a pull-up unit electrically connected to a second high voltage signal input terminal, the first node, and a cascade signal output terminal, configured to transmit signal input from the second high voltage signal input terminal to the cascade signal output terminal under a signal control of the first node; a pull-down control unit electrically connected to the first control signal input terminal, a second clock signal input terminal, a third clock signal input terminal, a second control signal input terminal, the first high voltage signal input terminal, the low voltage signal input terminal, a second cascade signal input terminal, and a third node, configured to transmit signal input from the first high voltage signal input terminal and/or the low voltage signal input terminal to the third node under common control of signal input from the first control signal input terminal, the second clock signal input terminal, the third clock signal input terminal, the second control signal input terminal, and the second cascade signal input terminal; a pull-down unit electrically connected to the third node, the low voltage signal input terminal, and the cascade signal output terminal, configured to transmit signal input from the low voltage signal input terminal to the cascade signal output terminal under a signal control of the third node; a jump control unit electrically connected to the third node, the low voltage signal input terminal, a first jump signal input terminal, a second jump signal input terminal, and the cascade signal output terminal, configured to transmit signal input from the low voltage signal input terminal to the third node and/or the cascade signal output terminal under control of signal input from the first jump signal input terminal and the second jump signal input terminal; wherein, a voltage input from the second high voltage signal input terminal is greater than a voltage input from the first high voltage signal input terminal.

In the display driving circuit of the present application, the first cascade signal input terminal of the driving unit of n stage is electrically connected to the cascade signal output terminal of the driving unit of n−2 stage, the second cascade signal input terminal of the driving unit of n stage is electrically connected to the cascade signal output terminal of the driving unit of n−2 stage; wherein n is an integer greater than 2.

Beneficial Effect

The display driving circuit provided by the present application includes a multi-stage driving unit. By separately providing a second high voltage signal input terminal in the driving unit of each stage, the high voltage signal input from the second high voltage signal input terminal can be directly transmitted to the cascade signal output terminal through the pull-up unit, and further enables the display driving circuit to output a high voltage driving signal. In addition, a gate voltage of a thin film transistor inside the display driving circuit can be kept low, which prevents an increase of internal stress of the thin film transistor, significantly improving a driving capability and driving stability of the display driving circuit.

DESCRIPTION OF DRAWINGS

In order to explain the embodiments, or the technical solutions in the prior art more clearly, the following will briefly introduce the drawings that need to be used in the description of the embodiments, or in the prior art. Obviously, the drawings in the following description are only some embodiments of the application. For those of ordinary skill in the art, other drawings can be obtained from these drawings without paying creative work.

DETAILED DESCRIPTION OF PREFERRED EMBODIMENTS

Figure 1:
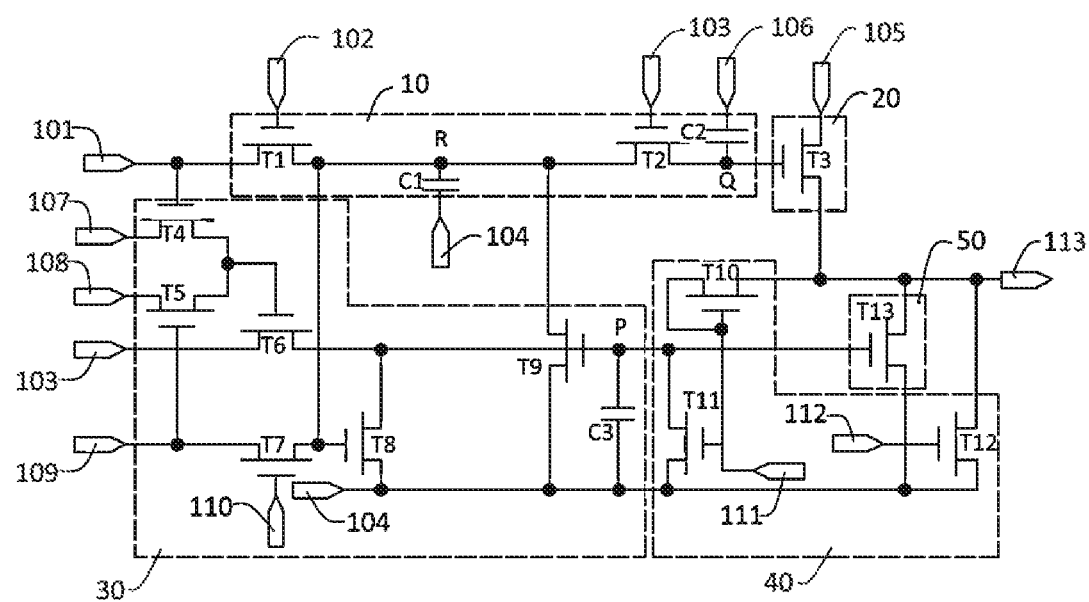
FIG. 1 is a schematic diagram showing a circuit structure of a single-stage driving unit of a display driving circuit provided by an embodiment of the present application.

The description of the following embodiments refers to the drawings to illustrate specific embodiments that can be implemented in this application. The directional terms mentioned in this application, such as "above", "below", "front", "back", "left", "right", "inner", "outer", "side", etc., are only directions for referring to the drawings. Therefore, the directional terms are used to illustrate and understand the application, rather than to limit the application. In the drawings, units with similar structures are indicated by the same reference numerals.

An embodiment of the present application provides a display driving circuit. The display driving circuit includes a multi-stage driving unit, and each stage of the driving unit is separately provided with a second high voltage signal input terminal, a high voltage signal input from the second high voltage signal input terminal is directly transmitted to a cascade signal output terminal through the pull-up unit so that the display driving circuit outputs a high voltage driving signal. In addition, since a high voltage signal input from the second high voltage signal input terminal does not directly act on a gate of a thin film transistor inside the display driving circuit, internal stress of the thin film transistor is prevented from increasing, and the driving capability and driving stability of the display driving circuit are significantly improved.

Refer to FIG. 1, which is a schematic diagram showing a circuit structure of a single-stage driving unit of a display driving circuit provided by an embodiment of the present application. The display driving circuit provided by the embodiment of the present application includes multiple stages of the driving unit, and a circuit structure of the driving unit of each stage is shown in FIG. 1. The driving unit of each stage includes a pull-up control unit 10, a pull-up unit 20, a pull-down control unit 30, a jump control unit 40, and a pull-down unit 50. It should be noted that there is an electrical connection between each unit module of the display driving unit, and each unit module has its specific function while working in coordination with other unit modules.

The pull-up control unit 10 is electrically connected to a first control signal input terminal 101, a first cascade signal input terminal 102, a low voltage signal input terminal 104, a first high voltage signal input terminal 103, a first clock signal input terminal 106, and a first node Q. The pull-up control unit 10 is configured to transmit a combination signal input from the first control signal input terminal 101, the low voltage signal input terminal 104, and the first clock signal input terminal 106 to the first node under control of signals input from the first cascade signal input terminal 102 and the first high voltage signal input terminal 103. It should be noted that the "combination of signal input from the first control signal input terminal 101, the low voltage signal input terminal 104, and the first clock signal input terminal 106" refers to signals formed by superimposing three of signals input from the first control signal input terminal 101, the low voltage signal input terminal 104, and the first clock signal input terminal 106.

Optionally, the pull-up control unit 10 includes a first transistor T1, a second transistor T2, a first capacitor C1, and a second capacitor C2; wherein a gate, a source, and a drain of the first transistor T1 are electrically connected to the first cascade signal input terminal 102, the first control signal input terminal 101, and a second node R, respectively; a gate, a source, and a drain of the second transistor T2 are electrically connected to the first high voltage signal input terminal 103, the second node R, and the first node Q, respectively; both ends of the first capacitor C1 are electrically connected to the low voltage signal input terminal 104 and the second node R respectively; and both ends of the second capacitor C2 are electrically connected to the first clock signal input terminal 106 and the first node Q, respectively.

It should be noted that the transistors used in the display driving circuit provided by the embodiments of the present application can be n-type transistors or p-type transistors. In order to facilitate understanding of this application, n-type transistors are used as examples for description in this embodiment. It should be understood that for an n-type transistor, when a gate of the transistor is at a high voltage, a source and a drain of the transistor are turned on, and the transistor is turned on, otherwise, the transistor is turned off; For a p-type transistor, when a gate of the transistor is at a low voltage, a source and a drain of the transistor are turned on, the transistor is turned on, and vice versa.

The pull-up unit 20 is electrically connected to the second high-voltage signal input terminal 105, the first node Q, and the cascade signal output terminal 113. The pull-up unit 20 is configured to transmit a signal input from the second high voltage signal input terminal 105 to the cascade signal output terminal 113 under a signal control of the first node Q. The voltage signal input from the second high voltage signal input terminal 105 is high voltage. Specifically, the voltage input from the second high voltage signal input terminal 105 is greater than the voltage input from the first high voltage signal input terminal 103. It should be understood that the high voltage signal input from the second high voltage signal input terminal 105 is directly transmitted to the cascade signal output terminal 113 through the pull-up unit 20, and transmitted to each display unit of the display panel through the cascade signal output terminal 113. Since the voltage signal input by the second high voltage signal input terminal 105 is greater, the entire row of display units in the display panel is more likely to be illuminated at the same time.

Optionally, the pull-up unit 20 includes a third transistor T3, and a gate, a source, and a drain of the third transistor T3 are electrically connected to the first node Q, the second high voltage signal input terminal 105, and the cascade signal output terminal 113, respectively. It should be understood that the third transistor T3 can control the conduction state between the second high voltage signal input terminal 105 and the cascade signal output terminal 113 under an action of the voltage of the first node Q.

The pull-down control unit 30 is electrically connected to the first control signal input terminal 101, a second clock signal input terminal 107, a third clock signal input terminal 108, a second control signal input terminal 109, the first high voltage signal input terminal 103, the low voltage signal input terminal 104, a second cascade signal input terminal 110, and a third node P. The pull-down control unit 30 is configured to transmit signal input from the first high voltage signal input terminal 103 and/or the low voltage signal input terminal 104 to the third node P under common control of signals input from the first control signal input terminal 101, the second clock signal input terminal 107, the third clock signal input terminal 108, the second control signal input terminal 109, and the second cascade signal input terminal 110. It should be understood that through the above circuit structure design, it can be ensured that the voltage signal of the third node P is maintained between a voltage signal input from the first high voltage signal input terminal 103 and a voltage signal input from the low voltage signal input terminal 104.

Optionally, the pull-down control unit 30 includes a fourth transistor T4, a fifth transistor T5, a sixth transistor T6, a seventh transistor T7, an eighth transistor T8, a ninth transistor T9, and a third capacitor C3. Wherein, a gate and a source of the fourth transistor T4 are electrically connected to the first control signal input terminal 101 and the second clock signal input terminal 107, respectively. A drain of the fourth transistor T4 is electrically connected to a drain of the fifth transistor T5 and a gate of the sixth transistor T6, a gate and a source of the fifth transistor T5 are electrically connected to the second control signal input terminal 109 and the third clock signal input terminal 108, respectively. A source and a drain of the sixth transistor T6 are electrically connected to the first high voltage signal input terminal 103 and the third node P, respectively. A gate and a source of the seventh transistor T7 are electrically connected to the second cascade signal input terminal 110 and the second control signal input terminal 109, respectively. A drain of the seventh transistor T7 is electrically connected to the second node R and a gate of the eighth transistor T8. A source and a drain of the eighth transistor T8 are electrically connected to the low voltage signal input terminal 104 and the third node P, respectively. A gate, a source, and a drain of the ninth transistor T9 are electrically connected to the third node P, the low voltage signal input terminal 104, and the second node R, respectively. Both ends of the third capacitor C3 are electrically connected to the low voltage signal input terminal 104 and the third node P, respectively. It should be understood that the highest voltage of the third node P is the voltage input by the first high voltage signal input terminal 103. The voltage value is less than the voltage value input from the second high voltage signal input terminal 105. Therefore, the voltage difference between the gate and the source of the ninth transistor T9 will not be too large and cause excessive stress, which is beneficial to the stability of its performance.

The jump control unit 40 is electrically connected to the third node P, the low voltage signal input terminal 104, a first jump signal input terminal 111, a second jump signal input terminal 112, and the cascade signal output terminal 113. The jump control unit 40 is configured to transmit signal input from the low voltage signal input terminal 112 to the third node P and/or the cascade signal output terminal 113 under control of signal input from the first jump signal input terminal 111 and the second jump signal input terminal 112. It should be noted that the jump control unit 40 is configured to enable the cascade signal output terminal 113 to output a low voltage signal when the display panel is switched from normal display mode to touch control mode. For example, when the display panel is switched from the normal display mode to the touch control mode, the first jump signal input terminal 111 inputs a low voltage, the second jump signal input terminal 112 inputs a high voltage, and the low voltage signal input from the low voltage signal input terminal 104 is transmitted to the cascade signal output terminal 113 through the jump control unit 40, to transmit a low voltage signal to the display panel.

Optionally, the jump control unit 40 includes a tenth transistor T10, an eleventh transistor T11, and a twelfth transistor T12. Wherein, a gate and a source of the tenth transistor T10 and a gate of the eleventh transistor T11 are electrically connected to the first jump signal input terminal 111, a drain of the tenth transistor T10 is electrically connected to the cascade signal output terminal 113, a source and a drain of the eleventh transistor T11 are electrically connected to the low voltage signal input terminal 104 and the third node P, respectively. A gate, a source, and a drain of the twelfth transistor T12 are electrically connected to the second transition signal input terminal 112, the low voltage signal input terminal 104, and the cascade signal output terminal 113, respectively.

The pull-down unit 50 is electrically connected to the third node P, the low voltage signal input terminal 104, and the cascade signal output terminal 113. The pull-down unit 50 is configured to transmit a signal input from the low voltage signal input terminal 104 to the cascade signal output terminal 113 under a signal control of the third node P, to enable the cascade signal output terminal 113 transmits a low voltage signal to the display panel.

Optionally, the pull-down unit 50 includes a thirteenth transistor T13, and a gate, a source, and a drain of the thirteenth transistor T13 are electrically connected to the third node P, the low voltage signal input terminal 104, and the cascade signal output terminal 113, respectively.

Figure 2:
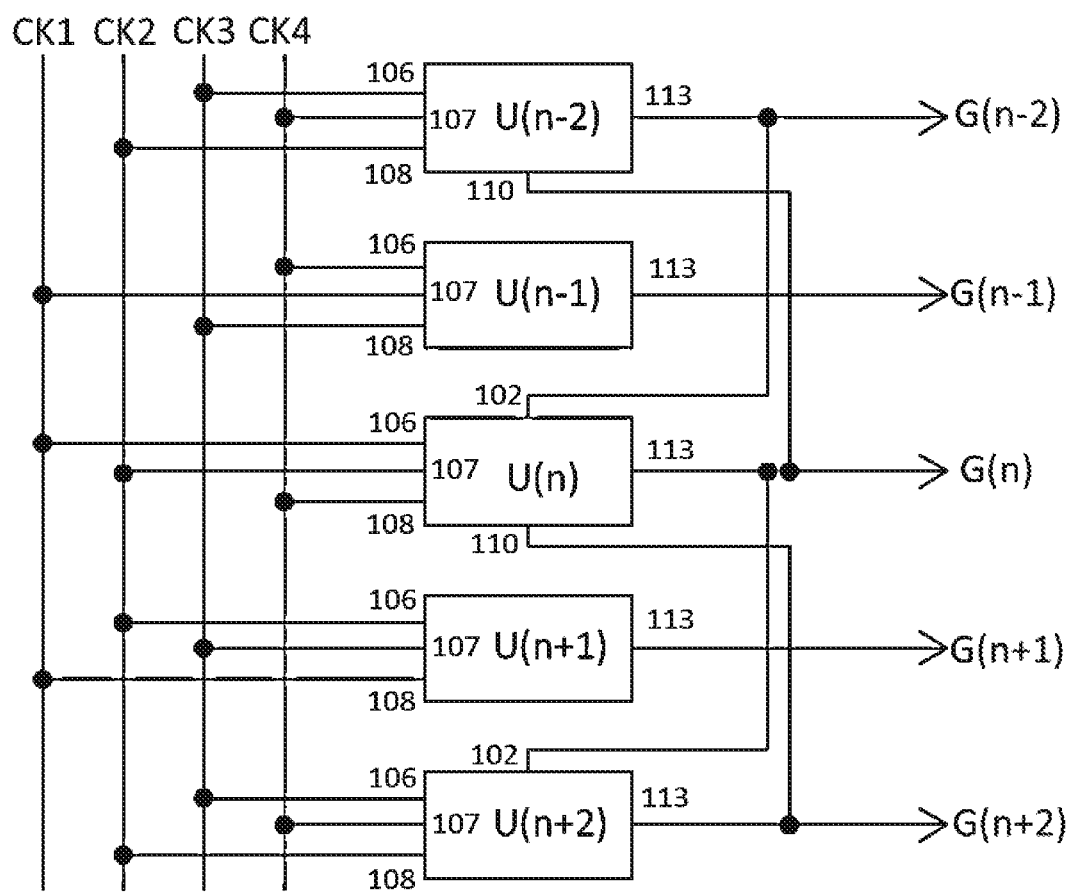
FIG. 2 is a schematic diagram of a cascade relationship of the display driving circuit provided by an embodiment of the present application.

Shown in FIG. 2 is a schematic diagram of a cascade relationship of the display driving circuit provided by an embodiment of the present application. The first cascade signal input terminal 102 of the driving unit U (n) of n stage is electrically connected to the cascade signal output terminal 113 of the driving unit U (n−2) of n−2 stage. The second cascade signal input terminal 110 of the driving unit U (n) of n stage is electrically connected to the cascade signal output terminal 113 of the driving unit U(n+2) of n+2 stage. The cascade signal output terminal 113 of the driving unit U (n) of n stage outputs a cascade signal G (n); where n is an integer greater than 2. It should be noted that the first cascade signal input terminal 102 of the driving unit of $1_{st}$ stage and the first cascade signal input terminal 102 of the driving unit of $2_{nd}$ stage are electrically connected to a trigger signal line, respectively. The display driving circuit is triggered as a whole through the trigger signal line.

Optionally, the display driving circuit is connected to four clock signal lines, which are a first clock signal line CK1, a second clock signal line CK2, a third clock signal line CK3, and a fourth clock signal line CK4. Specifically, the first clock signal input terminal 106, the second clock signal input terminal 107, and the third clock signal input terminal 108 of the driving unit of k+4i stage are electrically connected to the first clock signal line CK1, the second clock signal line CK2, and the fourth clock signal line CK4. Corresponding to this is a connection relationship between the clock signal input terminal of the driving unit U (n) of n stage and the clock signal line shown in FIG. 2. The first clock signal input terminal 106, the second clock signal input terminal 107, and the third clock signal input terminal 108 of the driving unit of k+4i+1 stage are electrically connected to the second clock signal line CK2, the third clock signal line CK3, and the first clock signal line CK1. Corresponding to this is a connection relationship between the clock signal input terminal of the driving unit U(n+1) of n+1 stage and a clock signal line shown in FIG. 2. The first clock signal input terminal 106, the second clock signal input terminal 107, and the third clock signal input terminal 108 of the driving unit of k+4i+2 stage are electrically connected to the third clock signal line CK3, the fourth clock signal line CK4, and the second clock signal line CK2. Corresponding to this is a connection relationship between the clock signal input terminal of the drive unit U (n+2) of n+2 stage and the clock signal line shown in FIG. 2. The first clock signal input terminal 106, the second clock signal input terminal 107, and the third clock signal input terminal 108 of the driving unit of k+4i+3 stage are electrically connected to the fourth clock signal line CK4, the first clock signal line CK1, and the third clock signal line CK3. Corresponding to this is a connection relationship between the clock signal input terminal of the drive unit U (n−1) of n−1 stage and a clock signal line shown in FIG. 2; where k is an integer greater than or equal to 1, and i is an integer greater than or equal to 0.

Optionally, the display driving circuit includes N-stage driving units. The display driving circuit can perform forward-scanning or reverse-scanning. When the first control signal input terminal 101 inputs a high voltage and the second control signal input terminal 109 inputs a low voltage, the display driving circuit scans forward. That is, the driving unit of $1_{st}$ stage to the driving unit of N stage sequentially output cascade signals. When the first control signal input terminal 101 inputs a low voltage and the second control signal input terminal 109 inputs a high voltage, the display driving circuit performs a reverse-scanning. That is, the driving unit of N stage to the driving unit of $1_{st}$ stage sequentially output cascade signals, where N is an integer greater than or equal to 1.

Figure 3:
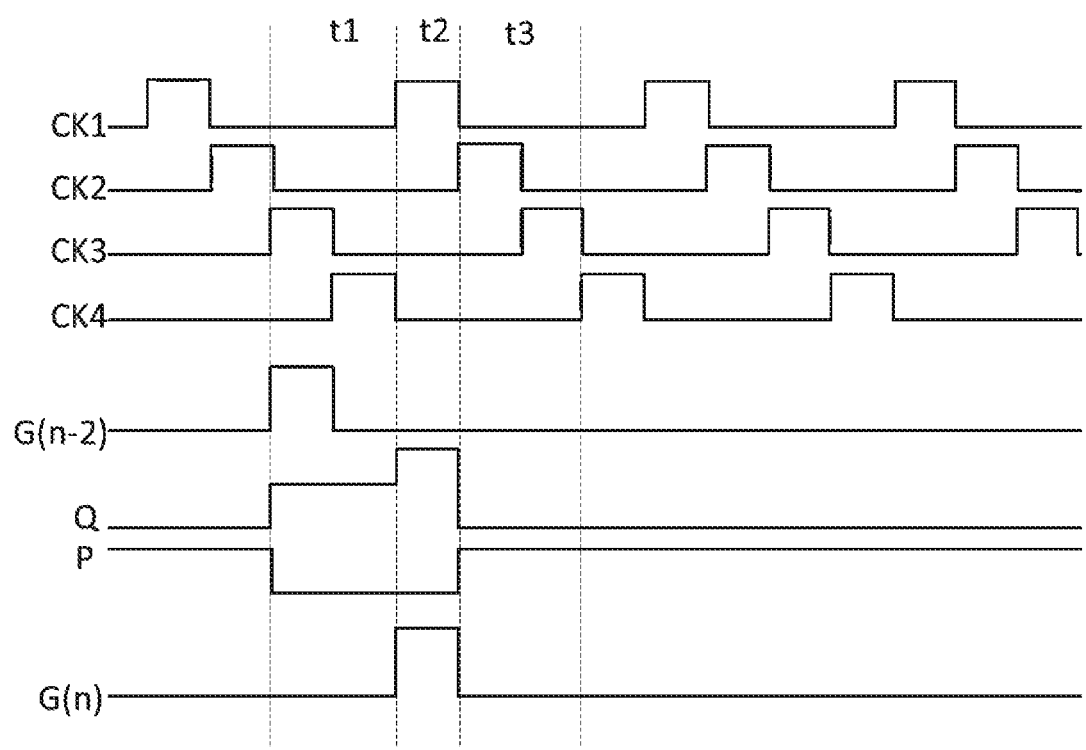
FIG. 3 is an input/output timing diagram of the display driving circuit provided by an embodiment of the application.

The following describes the input/output timing of the display driving circuit provided by an embodiment of the present application with reference to FIG. 1 to FIG. 3. FIG. 3 is an input/output timing diagram of the display driving circuit provided by an embodiment of the present application.

Take the driving unit of n stage as an example, the first control signal input terminal 101 inputs a high voltage, and the second control signal input terminal 109 inputs a low voltage:

In time period of t1, the cascade signal G (n−2) output from the cascade signal output terminal 113 of the drive unit U (n−2) of n−2 stage is switched to high voltage. The first transistor T1 and the second transistor T2 are turned on, and the high voltage signal input from the first control signal input terminal 101 is transmitted to the first node Q, so that the voltage of the first node Q goes up, but at this time, the voltage of the first node Q is not enough to turn on the third transistor T3. The voltage of the second node R also goes up, the eighth transistor T8 is turned on, the voltage signal input from the low voltage signal input terminal 104 is transmitted to the third node P, and the voltage of the third node P is reduced. The thirteenth transistor T13 is turned off, and the cascade signal output terminal 113 cannot receive any voltage signal and has no voltage output.

In time period of t2, the first transistor T1 is turned off, and the first clock signal input terminal 106 inputs a high voltage. Under an action of the second capacitor C2, voltage of the first node Q goes up twice to reach a turn-on voltage of the third transistor T3. The third transistor T3 is turned on, and the high voltage signal input from the second high voltage signal input terminal 105 is transmitted to the cascade signal output terminal 113, so the cascade signal output by the driving unit U (n) of n stage G(n) is a high voltage signal. The second node R is at high voltage, the eighth transistor T8 is kept in "on" state, the third node P is kept in a low voltage state, and the thirteenth transistor T13 is turned off. The cascade signal output terminal 113 outputs a high voltage signal.

In time period of t3, the first clock signal input terminal 106 inputs a low voltage. Under a cooperative action of the first capacitor C1 and the second capacitor C2, the voltages of the first node Q and the second node R are both reduced. Both the third transistor T3 and the eighth transistor T8 are turned off. The second clock signal input terminal 107 inputs a high voltage, the sixth transistor T6 is turned on, and the high voltage signal input from the first high voltage signal input terminal 103 is transmitted to the third node P, so that the voltage of third node P becomes higher. The thirteenth transistor T13 is turned on, the low voltage signal input terminal 104 reduces the voltage of the cascade signal output terminal 113 through the thirteenth transistor T13, and the cascade signal output terminal 113 has no voltage signal output.

As described above, the display driving circuits provided by embodiments of the present application include a multi-stage driving unit, and each stage of the driving unit is separately provided with a second high voltage signal input terminal, a high voltage signal input from the second high voltage signal input terminal is directly transmitted to a cascade signal output terminal through the pull-up unit so that the display driving circuit outputs a high voltage driving signal. In addition, since a high voltage signal input from the second high voltage signal input terminal does not directly act on a gate of a thin film transistor inside the display driving circuit, internal stress of the thin film transistor is prevented from increasing, and the driving capability and driving stability of the display driving circuit are significantly improved.

It should be noted that although the application is disclosed as above in specific embodiments, the embodiments are not intended to limit the application. Those of ordinary skill in the art can make various changes and modifications without departing from the spirit and scope of the application. Therefore, the protection scope of the application is subject to the scope defined by the claims.

What is claimed is:

1. A display driving circuit comprising a multi-stage driving unit, wherein each stage of the driving unit comprises:
    a pull-up control unit electrically connected to a first control signal input terminal, a first cascade signal input terminal, a low voltage signal input terminal, a first high voltage signal input terminal, a first clock signal input terminal, and a first node, configured to transmit a combination signal input from the first control signal input terminal, the low voltage signal input terminal, and the first clock signal input terminal to the first node under control of signals input from the first cascade signal input terminal and the first high voltage signal input terminal;
    a pull-up unit electrically connected to a second high voltage signal input terminal, the first node, and a cascade signal output terminal, configured to transmit a signal input from the second high voltage signal input terminal to the cascade signal output terminal under a signal control of the first node; and
    a pull-down control unit electrically connected to the first control signal input terminal, a second clock signal input terminal, a third clock signal input terminal, a second control signal input terminal, the first high voltage signal input terminal, the low voltage signal input terminal, a second cascade signal input terminal, and a third node, configured to transmit signal input from the first high voltage signal input terminal and/or the low voltage signal input terminal to the third node under common control of signals input from the first control signal input terminal, the second clock signal input terminal, the third clock signal input terminal, the second control signal input terminal, and the second cascade signal input terminal;
    wherein the pull-down control unit comprises a fourth transistor, a fifth transistor, a sixth transistor, a seventh transistor, an eighth transistor, a ninth transistor, and a third capacitor, a gate and a source of the fourth transistor are electrically connected to the first control signal input terminal and the second clock signal input terminal, respectively, a drain of the fourth transistor is electrically connected to a drain of the fifth transistor and a gate of the sixth transistor, a gate and a source of the fifth transistor are electrically connected to the second control signal input terminal and the third clock signal input terminal, respectively, a source and a drain of the sixth transistor are electrically connected to the first high voltage signal input terminal and the third node, respectively, a gate and a source of the seventh transistor are electrically connected to the second cascade signal input terminal and the second control signal input terminal, respectively, a drain of the seventh transistor is electrically connected to a gate of the eighth transistor, a source and a drain of the eighth transistor are electrically connected to the low voltage signal input terminal and the third node, respectively, a gate and a source of the ninth transistor are electrically connected to the third node and the low voltage signal input terminal, respectively, and both ends of the third capacitor are electrically connected to the low voltage signal input terminal and the third node, respectively;
    wherein a voltage input from the second high voltage signal input terminal is greater than a voltage input from the first high voltage signal input terminal.

2. The display driving circuit according to claim 1, wherein the pull-up control unit comprises a first transistor, a second transistor, a first capacitor, and a second capacitor, a gate, a source, and a drain of the first transistor are electrically connected to the first cascade signal input terminal, the first control signal input terminal, and a second node, respectively, a gate, a source, and a drain of the second transistor are electrically connected to the first high voltage signal input terminal, the second node, and the first node, respectively, both ends of the first capacitor are electrically connected to the low voltage signal input terminal and the second node, respectively, and both ends of the second capacitor are electrically connected to the first clock signal input terminal and the first node, respectively.

3. The display driving circuit according to claim 2, wherein the pull-up unit comprises a third transistor, and a gate, a source, and a drain of the third transistor are electrically connected to the first node, the second high voltage signal input terminal, and the cascade signal output terminal, respectively.

4. The display driving circuit according to claim 1, wherein each stage of the driving unit further comprises a pull-down unit electrically connected to the third node, the low voltage signal input terminal, and the cascade signal output terminal, configured to transmit a signal input from the low voltage signal input terminal to the cascade signal output terminal under a signal control of the third node.

5. The display driving circuit according to claim 4, wherein the pull-down unit comprises a thirteenth transistor, and a gate, a source, and a drain of the thirteenth transistor are electrically connected to the third node, the low voltage signal input terminal, and the cascade signal output terminal, respectively.

6. The display driving circuit according to claim 4, wherein each stage of the driving unit further comprises a jump control unit electrically connected to the third node, the low voltage signal input terminal, a first jump signal input terminal, a second jump signal input terminal, and the cascade signal output terminal, configured to transmit signal input from the low voltage signal input terminal to the third node and/or the cascade signal output terminal under control of signal input from the first jump signal input terminal and the second jump signal input terminal.

7. The display driving circuit according to claim 6, wherein the jump control unit comprises a tenth transistor, an eleventh transistor, and a twelfth transistor, a gate and a source of the tenth transistor and a gate of the eleventh transistor are electrically connected to the first jump signal input terminal, a drain of the tenth transistor is electrically connected to the cascade signal output terminal, a source and a drain of the eleventh transistor are electrically connected to the low voltage signal input terminal and the third node, respectively, and a gate, a source, and a drain of the twelfth transistor are electrically connected to the second jump signal input terminal, the low voltage signal input terminal, and the cascade signal output terminal, respectively.

8. The display driving circuit according to claim 1, wherein the first cascade signal input terminal of the driving unit of n stage is electrically connected to the cascade signal output terminal of the driving unit of n−2 stage, wherein n is an integer greater than 2.

9. The display driving circuit according to claim 1, wherein the second cascade signal input terminal of the driving unit of n stage is electrically connected to the cascade signal output terminal of the driving unit of n+2 stage, wherein n is an integer greater than 2.

10. The display driving circuit according to claim 6, wherein the display driving circuit is connected to four clock signal lines, which are a first clock signal line, a second clock signal line, a third clock signal line, and a fourth clock signal line;

the first clock signal input terminal, the second clock signal input terminal, and the third clock signal input terminal of the driving unit of k+4i stage are electrically connected to the first clock signal line, the second clock signal line, and the fourth clock signal line;

the first clock signal input terminal, the second clock signal input terminal, and the third clock signal input terminal of the driving unit of k+4i+1 stage are electrically connected to the second clock signal line, the third clock signal line, and the first clock signal line;

the first clock signal input terminal, the second clock signal input terminal, and the third clock signal input terminal of the driving unit of k+4i+2 stage are electrically connected to the third clock signal line, the fourth clock signal line, and the second clock signal line; and the first clock signal input terminal, the second clock signal input terminal, and the third clock signal input terminal of the driving unit of k+4i+3 stage are electrically connected to the fourth clock signal line, the first clock signal line, and the third clock signal line;

wherein k is an integer greater than or equal to 1, and i is an integer greater than or equal to 0.

11. The display driving circuit according to claim 1, wherein the first cascade signal input terminal of the driving unit of $1_{st}$ stage and the first cascade signal input terminal of the driving unit of $2_{nd}$ stage are respectively electrically connected to a trigger signal line.

12. The display driving circuit according to claim 1, wherein the display driving circuit comprises the driving unit of N stages, the first control signal input terminal is configured to be input with a high voltage, and the second control signal input terminal is configured to be input with a low voltage, and $1_{st}$ stage to N stage of the driving unit sequentially output cascade signals, wherein N is an integer greater than or equal to 1.

13. The display driving circuit according to claim 1, wherein the display driving circuit comprises the driving unit of N stages, the first control signal input terminal is configured to be input with a low voltage, and the second control signal input terminal is configured to be input with a high voltage, and the driving unit of N stage to the driving unit of $1_{st}$ stage sequentially output cascade signals, wherein N is an integer greater than or equal to 1.

14. A display driving circuit comprising a multi-stage driving unit, wherein each stage of the driving unit comprises:

a pull-up control unit electrically connected to a first control signal input terminal, a first cascade signal input terminal, a low voltage signal input terminal, a first high voltage signal input terminal, a first clock signal input terminal, and a first node, configured to transmit combination signal input from the first control signal input terminal, the low voltage signal input terminal, and the first clock signal input terminal to the first node under control of signals input from the first cascade signal input terminal and the first high voltage signal input terminal;

a pull-up unit electrically connected to a second high voltage signal input terminal, the first node, and a cascade signal output terminal, configured to transmit signal input from the second high voltage signal input terminal to the cascade signal output terminal under a signal control of the first node;

a pull-down control unit electrically connected to the first control signal input terminal, a second clock signal input terminal, a third clock signal input terminal, a second control signal input terminal, the first high voltage signal input terminal, the low voltage signal input terminal, a second cascade signal input terminal, and a third node, configured to transmit signal input from the first high voltage signal input terminal and/or the low voltage signal input terminal to the third node under common control of signal input from the first control signal input terminal, the second clock signal input terminal, the third clock signal input terminal, the second control signal input terminal, and the second cascade signal input terminal;

a pull-down unit electrically connected to the third node, the low voltage signal input terminal, and the cascade signal output terminal, configured to transmit signal input from the low voltage signal input terminal to the cascade signal output terminal under a signal control of the third node; and a jump control unit electrically connected to the third node, the low voltage signal input terminal, a first jump signal input terminal, a second jump signal input terminal, and the cascade signal output terminal, configured to transmit signal input from the low voltage signal input terminal to the third node and/or the cascade signal output terminal under control of signal input from the first jump signal input terminal and the second jump signal input terminal;

wherein, a voltage input from the second high voltage signal input terminal is greater than a voltage input from the first high voltage signal input terminal.

15. The display driving circuit according to claim 14, wherein the first cascade signal input terminal of the driving unit of n stage is electrically connected to the cascade signal output terminal of the driving unit of n−2 stage, and the second cascade signal input terminal of the driving unit of n stage is electrically connected to the cascade signal output terminal of the driving unit of n−2 stage, wherein n is an integer greater than 2.

* * * * *